United States Patent
Wittl et al.

(10) Patent No.: US 6,903,326 B2
(45) Date of Patent: Jun. 7, 2005

(54) OPTO-ELECTRONIC ASSEMBLY HAVING DETECTORS FOR CONVERTING OPTICAL SIGNALS

(75) Inventors: Josef Wittl, Regensburg (DE); Hans Hurt, Regensburg (DE)

(73) Assignee: Infineon Technologies AG, Munich (DE)

( * ) Notice: Subject to any disclaimer, the term of this patent is extended or adjusted under 35 U.S.C. 154(b) by 134 days.

(21) Appl. No.: 10/022,662

(22) Filed: Dec. 18, 2001

(65) Prior Publication Data

US 2002/0079429 A1 Jun. 27, 2002

(30) Foreign Application Priority Data

Dec. 18, 2000 (DE) .......................................... 100 64 580

(51) Int. Cl.[7] .............................................. H01L 31/00
(52) U.S. Cl. .................................... 250/214.1; 257/435
(58) Field of Search ......................... 250/214.1, 214 B, 250/214 R; 257/435, 458

(56) References Cited

U.S. PATENT DOCUMENTS

| | | | |
|---|---|---|---|
| 4,127,862 A | * 11/1978 | Ilegems et al. | ............ 257/184 |
| 4,258,260 A | 3/1981 | Obara et al. | ............. 250/338.3 |
| 4,651,001 A | 3/1987 | Harada et al. | ............. 250/330 |
| 4,792,997 A | 12/1988 | Toussaint et al. | .......... 398/202 |
| 5,214,272 A | * 5/1993 | Ueno | ..................... 250/208.1 |
| 5,455,415 A | * 10/1995 | Yamada et al. | .......... 250/214.1 |
| 5,751,049 A | 5/1998 | Goodwin | .................... 257/440 |
| 6,271,943 B1 | * 8/2001 | Goossen | ........................ 398/9 |

FOREIGN PATENT DOCUMENTS

| | | |
|---|---|---|
| JP | 62 108 582 | 5/1987 |
| JP | 02-147923 A | * 6/1990 |

* cited by examiner

Primary Examiner—Thanh X. Luu
(74) Attorney, Agent, or Firm—Laurence A. Greenberg; Werner H. Stemer; Ralph E. Locher

(57) ABSTRACT

The opto-electronic assembly receiving optical signals. Two detectors, each with an optically active area, convert optical signals into electrical signals. Two of the detectors are arranged on each other, and the optically active area of one detector is shielded. The opto-electronic assembly receives the optical signals and detects interference signals reliably. The assembly requires little space within an opto-electronic structure and can be produced simply and cost-effectively.

16 Claims, 4 Drawing Sheets

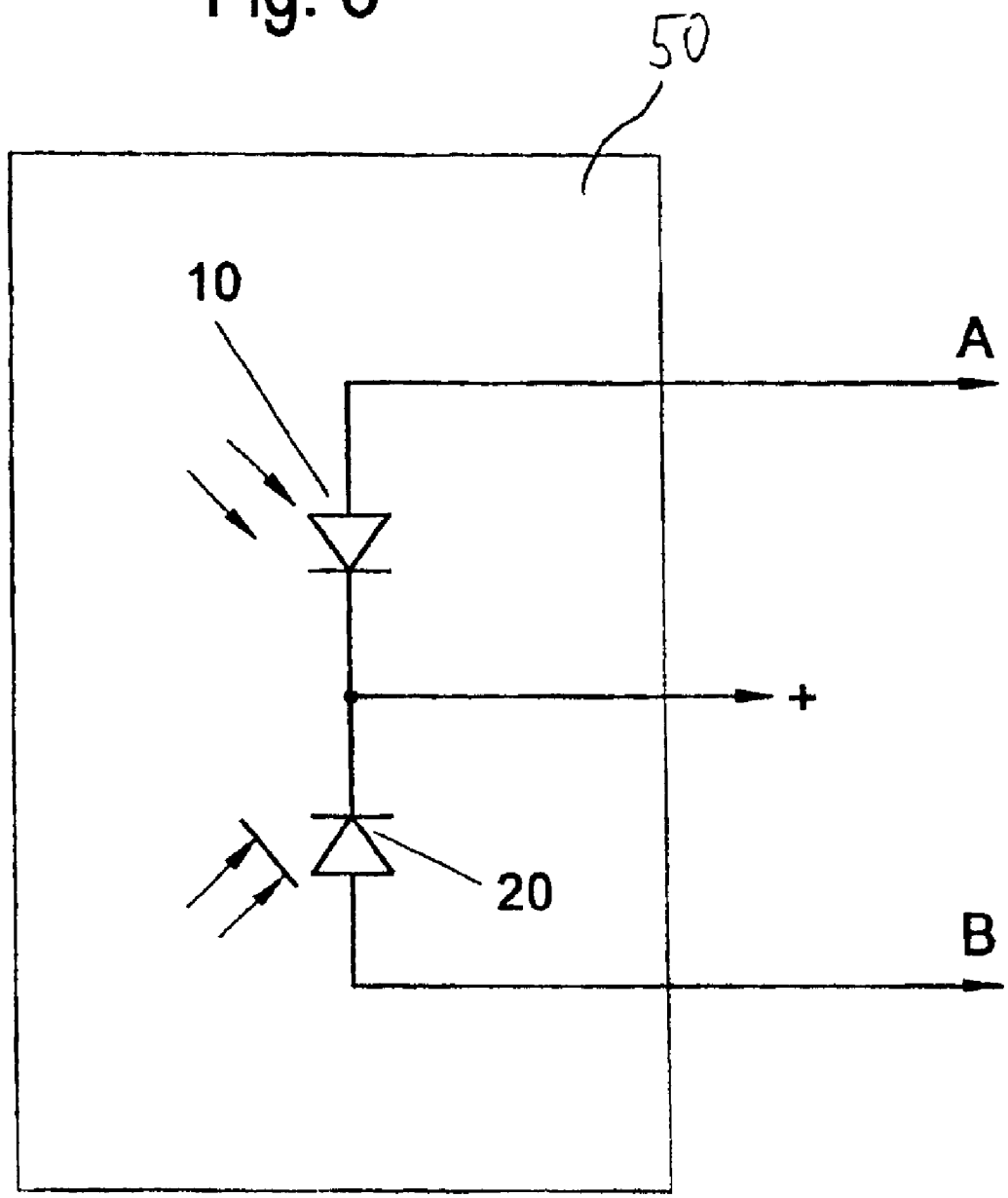

OPTO-ELECTRONIC ASSEMBLY HAVING DETECTORS FOR CONVERTING OPTICAL SIGNALS

BACKGROUND OF THE INVENTION

Field of the Invention

The invention relates to an opto-electronic assembly or subassembly for receiving optical signals. The opto-electronic assembly has at least two detectors, which each have an optically active area for converting optical signals into electrical signals.

In optical telecommunications technology, optical receivers are used to convert optical signals into electrical signals. Such a receiver, generally a photodiode, has an optically active area. Optical signals which fall onto the optically active area are detected by the latter and converted into electrical signals. These signals are then amplified directly in the receiver or in separate evaluation units.

Because of the incidence of scattered light, dark currents and other electromagnetic interference, interference signals occur in the optical receivers. These impair the function of the optical receivers, since they make the signal/noise ratio worse.

U.S. Pat. No. 4,792,997 describes a generic opto-electronic subassembly for receiving optical signals which, for the purpose of interference signal suppression, mixes the signals from two photodiodes with each other and then amplifies them. In that case, one signal originates from a non-illuminated photodiode, which is fitted beside an illuminated, identical photodiode and with which electrical contact is made in the same way. The non-illuminated photodiode supplies an interference signal which is identical or at least similar to that from the illuminated photodiode. The interference signal can then be separated from the signal to be detected, for example by means of a differential amplifier.

The disadvantage with such subassemblies is that the use of a second photodiode requires twice the amount of space in the component. In addition, special measures for darkening the interference signal generator, that is to say the second photodiode, are necessary, for example metalization of the active area. A complicated design of the carrier and costly shielding of the second photodiode are therefore necessary.

SUMMARY OF THE INVENTION

It is accordingly an object of the invention to provide an opto-electronic assembly for receiving optical signals, which overcomes the above-mentioned disadvantages of the heretofore-known devices and methods of this general type and which detects interference signals reliably, at the same time needs as little space as possible within an opto-electronic configuration and can be produced simply and cost-effectively.

With the foregoing and other objects in view there is provided, in accordance with the invention, an opto-electronic assembly for receiving optical signals, comprising:

at least two detectors each with an optically active area for converting optical signals into electrical signals, the at least two detectors being arranged on one another, and the optically active area of one of the detectors is shielded.

In other words, the invention provides for two detectors of optical signals on each other instead of beside each other. As a result, more than half the overall space otherwise needed is saved, and a high level of integration is achieved. In addition, electric contact may be made with the detectors in a space-saving and simple way. The optically active area of one detector is in this case shielded from the electromagnetic radiation to be detected. This detector therefore functions as an interference signal generator.

The shielding of the optically active area of the one detector can be carried out by means of the other detector, but also in any other desired way. For example, it is likewise possible for the shielding of the one detector to be carried out by means of a carrier, on which the detector is arranged, or by spraying the optically active area with an optically dense material. It is also conceivable to shield the one detector by means of a housing or housing parts, if the optically active areas of the detectors point in opposite directions.

Mounting the two detectors directly on each other may advantageously be carried out by means of the known fabrication steps from chip-flip or chip-on-chip fittings. In this case, a first detector is mounted on a carrier and a second detector is placed on the first detector, either with or without the interposition of an additional substrate, for example electrically insulating material.

As a result of the chip-on-chip arrangement of the detectors, it is in principle possible to dispense with a ceramic normally used under an individual photodiode.

In accordance with an added feature of the invention, the mounting of the detectors is preferably carried out in such a way that the two active areas of the detectors are either pointing or facing in two opposite directions or in the same direction. As a result, either the active area of the detector facing the carrier is shielded, if there are no transparent openings on the carrier, or else the active area which is located between the two detectors.

This has the additional advantage that specific coatings of the active area or specific shielding elements can be dispensed with, which in turn saves costs.

In the case of the mounting with two active optical areas pointing in opposite directions, the outer area of one detector is advantageously greater than the outer area located opposite it and belonging to the other detector, by which means making contact and mounting are simplified.

Contact is preferably made with the detectors either via a conductive intermediate layer or via electrical feedlines which, for their part, can in turn be insulated from each other by appropriate intermediate layers or can be conductively connected.

For the reception of optical signals through the carrier, the latter has an optically transparent opening, in particular a cutout or a window. The optical detectors are in this case mounted on each other in such a way that their optically active areas both point in the direction of the carrier, and the detector mounted directly on the carrier is arranged with its optically active area over the optical opening.

In order that the interference signals from the detectors are comparable, the detectors are advantageously designed to be identical or of similar construction, or at least their optically active areas are designed to be identical or of similar construction.

The signals from the detectors arranged above each other are mixed and then amplified in an evaluation unit connected downstream. The evaluation unit is preferably formed by a differential amplifier, which subtracts the interference signal from the detected useful signal.

In accordance with a concomitant feature of the invention, the detectors are suitably designed photodiodes. In particular, two photodiodes are mounted with their cathode areas electrically conductively on each other. As a result, there are no voltage differences, or only very small ones, between the cathode areas.

Other features which are considered as characteristic for the invention are set forth in the appended claims.

Although the invention is illustrated and described herein as embodied in an opto-electronic subassembly for receiving optical signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a schematic representation of a chip-on-chip construction according to the invention with a mounting subunit.

DESCRIPTION OF THE PREFERRED EMBODIMENTS

Figure 1:
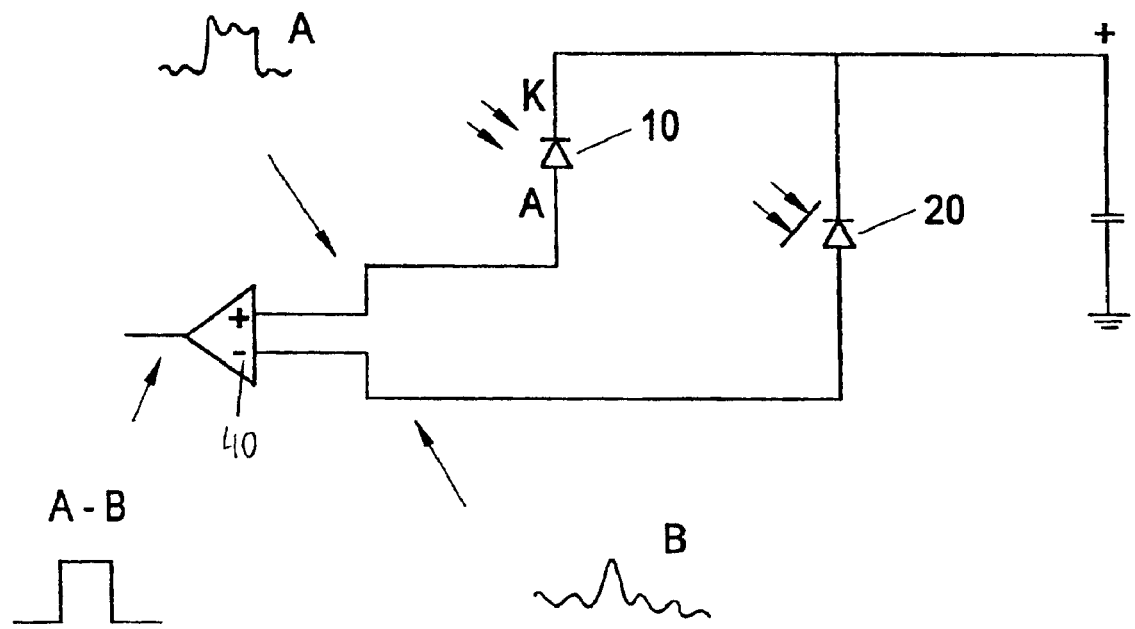
FIG. 1 is a schematic illustrating interference signal suppression using two photodiodes.

Referring now to the figures of the drawing in detail and first, particularly, to FIG. 1 thereof, there is illustrated the principle of interference signal suppression in the case of separate detection firstly of a useful and interference signal and secondly only of the interference signal.

Two photodiodes 10, 20 are connected to the two inputs of a differential amplifier 40. One photodiode 10 is arranged in such a way that an optical signal is detected and supplied to the differential amplifier 40 as an electrical signal A. The photodiode 20 is shielded against an incidence of light. It therefore generates only an interference signal B, which is supplied to the other input of the differential amplifier 40.

The signal B from the non-illuminated photodiode 20 can be attributed in particular to dark currents or other electromagnetic interference. This interference also produces an interference signal, which is superposed on the useful signal, in the signal A from the illuminated photodiode 10.

In order to obtain comparable interference signals, the photodiodes 10, 20 are designed to be as identical as possible, so that they possess the same photon yields and losses.

In the differential amplifier 40, the signal B from the non-illuminated photodiode 20 is subtracted from the signal A originating from the illuminated photodiode 10, and the difference between the signals A–B is amplified. By means of the separate detection of useful and interference signal, on the one hand, and interference signal, on the other hand, and the subsequent formation of a difference, the interference signal is separated from the useful signal. This permits a signal/noise ratio of the receiving unit which, over a wide range, is independent of ambient conditions such as temperature, cosmic radiation, or other radiation fields. The signal to noise ratio, therefore, is very high.

It will be understood by those skilled in the pertinent art that the type of mixing and amplification of the signals A, B from the photodiodes 10, 20 can also be carried out via other electronic circuits than a differential amplifier.

Figure 2A:
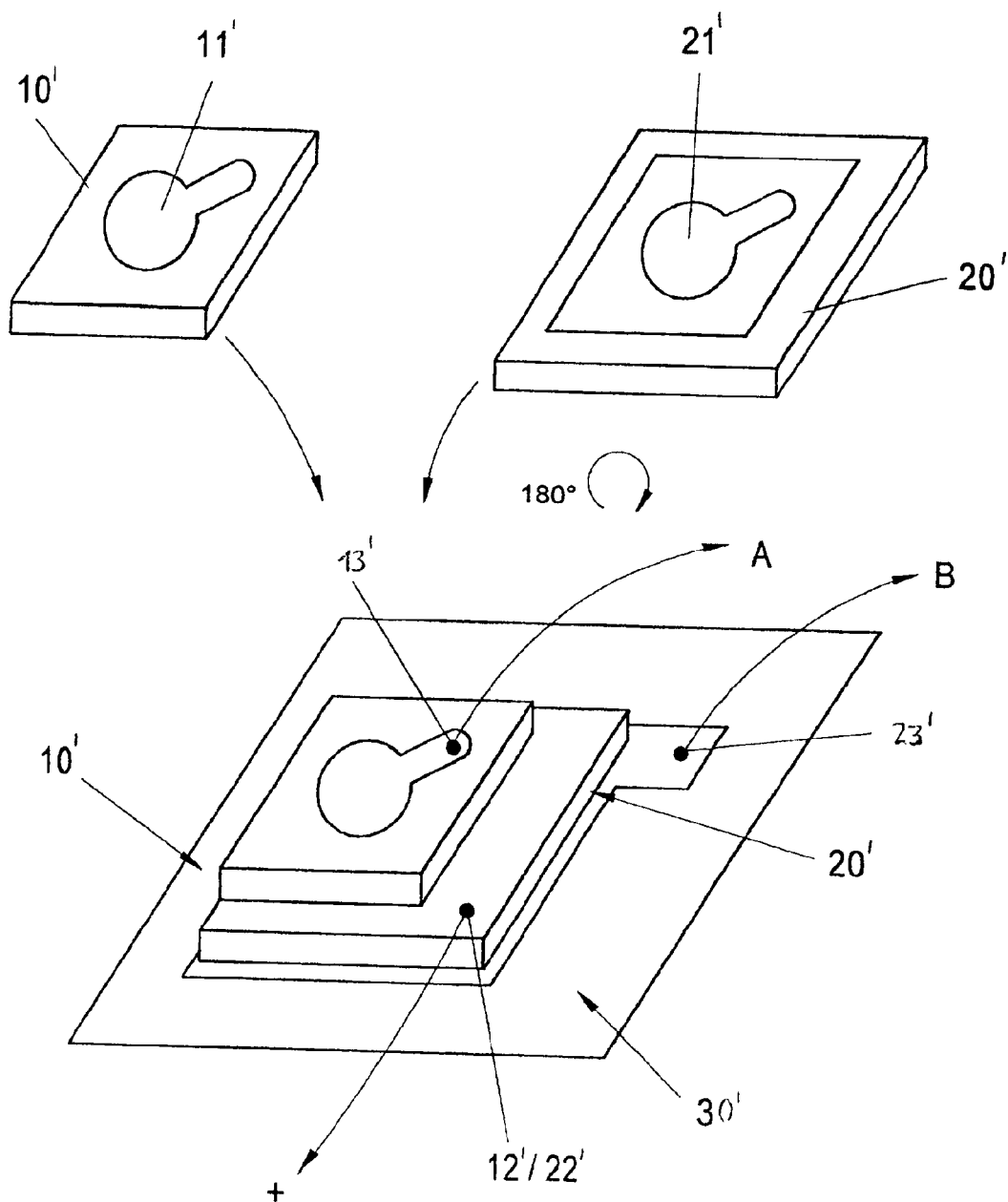
FIG. 2a is a exploded perspective view of a first configuration according to the invention of two photodiodes on a carrier.

FIG. 2a shows a first configuration according to the invention of two photodiodes 10', 20' having optically active areas 11', 21' on a carrier 30'. The carrier 30' is, for example, a leadframe or a carrier plate.

The photodiodes 10', 20' are mounted above each other or on each other. Their optically active areas 11', 21' point in opposite directions, since the photodiode 20', as indicated by the 180° arrow, is fixed to the carrier 30' so as to be rotated through 180°. In this case, the shielding of the optically active area 21' of the photodiode 20' is effected by the carrier 30'. On the other hand, the optically active area of the photodiode 10' is able to detect optical signals unhampered.

Alternatively, provision can be made for the optically active areas of the two photodiodes to point in the same direction, specifically away from the carrier 30'. In that case, the photodiode 10' covers the optically active area 21' of the photodiode 20'. In that case, the rotation of the diode 20' as indicated by the 180° arrow would be omitted.

The photodiodes 10', 20' of FIG. 2a have mutually facing cathode contacts 12', 22'. Contact is therefore made with the cathode contacts 12', 22' by means of a common back contact. As a result, a feedline is saved. The two cathode contacts 12', 22' are connected to each other, for example by a conductive adhesive, so that both cathode contacts 12', 22' are at the same electrical potential. The electrical signals A, B from the photodiodes 10', 20' are tapped off at anode contacts 13', 23' of the photodiodes.

In the configuration of FIG. 2a, the photodiode 20' mounted on the carrier 30' has a greater extent than the photodiode 10' mounted on it. As a result, both mounting and making contact are made easier.

It will be understood that, in alternative embodiments, an additional substrate, in particular an insulator, can be fitted underneath the photodiode 10' that detects the useful signal. Likewise, an additional substrate can also be provided between the lower photodiode 20' and the carrier 30'.

Figure 2B:
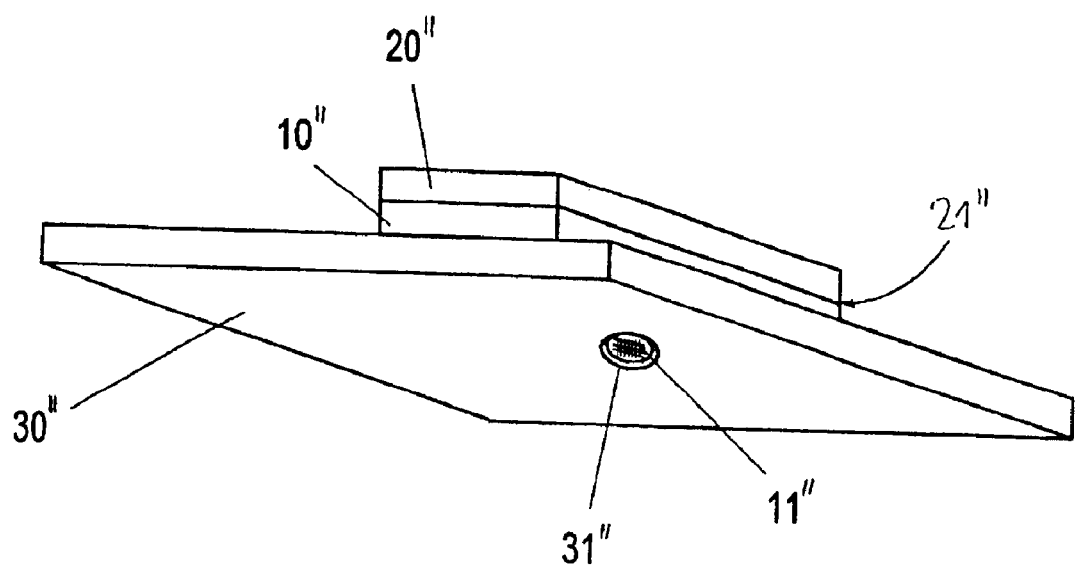
FIG. 2b is a perspective view of a second embodiment of the invention of two photodiodes on a carrier.

In the configuration illustrated in FIG. 2b, the carrier 30" has an optically transparent opening 31", through which light falls onto the active area 11" of the photodiode 10" mounted on the carrier 30". The optically active areas 11", 21" of the photodiodes 10", 20" point in the same direction in this embodiment, specifically in the direction of the carrier 30".

The opening 31" consists either of a hole or is provided with optical windows or else lenses.

Likewise, provision can be made to spray the receiving unit with an optically dense material. This prevents the undesired incidence of scattered light on the photodiodes, which leads to an increased interference signal.

In an alternative configuration of FIG. 2b, the optically active area of the photodiode 20" points upward, that is to say the two optically active areas point in opposite directions. The optically active area of the photodiode 20" is then preferably darkened by a sprayed compound, for example a metal layer. In addition, if the optically active areas "look away from each other", it is possible to shield the optically active area of the photodiode 20" to be shielded by means of a housing.

The arrangements of FIGS. 2a, 2b are of very space-saving design and permit interference signal detection and compensation even in small optical receivers. In addition, as compared with the prior art, devices for shielding the active areas of the photodiodes can be dispensed with.

The mounting of the photodiodes 10', 10", 20', 21" on the carrier 30', 30" can be carried out by fitting the individual components directly on the carrier. In this case, the photodiodes are fixed directly to each other "chip-on-chip" or to the carrier. This is carried out, for example, by means of adhesive bonding, fusing, soldering or insertion into guide frames or other guide elements on the carrier. At the same time, as mentioned, the fitting of intermediate layers to prevent or else improve electrical and/or thermal contact between the individual components is also possible.

The chip-on-chip construction also permits fabrication in the wafer composite, forming mounting subunits, submounts, as they are known, which can be tested for their function in relatively large units before being installed. Therefore, possible malfunctions do not first occur in a finished receiving element and following complete fabrication.

Such a submount 50 is indicated in FIG. 3. It comprises the photodiodes 10, 20 arranged on a carrier, and the corresponding contact-making and connecting parts for the power supply and for coupling out the electrical signals A, B.

It is pointed out that the photodiode that detects the interference signal on the submount does not yet need to be darkened. This can be carried out, for example following mounting of the submount, by spraying with an optically dense material.

The fabrication of the submounts is carried out, for example, by a photodiode wafer firstly being fitted completely with photodiodes 10, 20 and tested and then sawn into individual submounts. In that case, the wafer can also comprise a substrate. However, it is likewise possible to dispense with a substrate, that is to say the unsawn photodiode wafer merely comprises photodiodes 10, 20 and possibly one or more bonding connections between them. In this case, one photodiode is preferably produced as a wafer first and is then fitted with the second photodiode. Following the testing of the arrangement, the photodiode wafer is sawn up, and the submount is then mounted, for example on a leadframe.

If there is additionally a substrate under the photodiode 10 that detects the useful signal, this substrate can also be produced as a wafer or generally in the composite and then fitted with photodiodes 10, 20, tested and then sawn up into submounts, the latter then being used in construction.

The invention is not restricted to the exemplary embodiments explained above. The important feature in the invention is merely that, in the case of an opto-electronic subassembly, at least two detectors are arranged on each other and, at the same time, the optically active area of one detector is shielded.

We claim:

1. An opto-electronic assembly for receiving optical signals, comprising:
    at least two detectors each with an optically active area for converting optical signals into electrical signals, said at least two detectors being arranged and mounted on one another, and said optically active area of one of said detectors being completely shielded from the optical signals and the shielded detector operating as an interference signal generator.

2. The opto-electronic assembly according to claim 1, which further comprises a carrier supporting one of said detectors.

3. The opto-electronic assembly according to claim 1, wherein said active areas of said detectors face in mutually opposite directions.

4. The opto-electronic assembly according to claim 2, wherein said active area of one of said detectors is disposed directly opposite said carrier and is thereby shielded from optical signals.

5. The opto-electronic assembly according to claim 1, wherein said active areas of said detectors face in a same direction, and said active area of one detector is shielded by the other detector.

6. The opto-electronic assembly according to claim 1, which comprises an intermediate layer disposed between said detectors.

7. The opto-electronic assembly according to claim 2, which comprises at least one intermediate layer disposed between one of said detectors and said carrier.

8. The opto-electronic assembly according to claim 2, wherein said carrier is formed with at least one optically transparent opening, and said opening is functionally associated with said active area of the unshielded detector.

9. The opto-electronic assembly according to claim 1, which comprises optically dense material darkening said optically active area of said one detector.

10. The opto-electronic assembly according to claim 9, wherein said optically dense material is a sprayed compound.

11. The opto-electronic assembly according to claim 1, wherein said detectors have substantially identical active areas.

12. The opto-electronic assembly according to claim 1, wherein said detectors have similar active areas.

13. The opto-electronic assembly according to claim 1, which comprises an evaluation device connected to said detectors to evaluate the electrical signals.

14. The opto-electronic assembly according to claim 13, wherein said evaluation device has at least one differential amplifier.

15. The opto-electronic assembly according to claim 1, wherein said detectors are photodiodes.

16. The opto-electronic assembly according to claim 15, wherein said photodiodes have cathode and anode contacts for making electrical contact, and said cathode contacts of said at least two photodiodes are arranged on one another in an electrically conductive manner.

* * * * *